US006759916B2

(12) United States Patent
Ishizaki et al.

(10) Patent No.: US 6,759,916 B2
(45) **Date of Patent: *Jul. 6, 2004**

(54) HIGH-FREQUENCY FILTER DEVICE, FILTER DEVICE COMBINED TO A TRANSMIT-RECEIVE ANTENNA, AND WIRELESS APPARATUS USING THE SAME

(75) Inventors: Toshio Ishizaki, Kobe (JP); Toru Yamada, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/395,136

(22) Filed: Mar. 25, 2003

(65) Prior Publication Data

US 2003/0184402 A1 Oct. 2, 2003

Related U.S. Application Data

(62) Division of application No. 09/964,691, filed on Sep. 28, 2001, now Pat. No. 6,577,205.

(30) Foreign Application Priority Data

May 11, 2001 (JP) .................................... P2001-141208

(51) Int. Cl.[7] ........................ H03H 11/04; H03H 21/00; H03H 11/34; H01P 1/203

(52) U.S. Cl. ...................... 333/17.1; 333/132; 333/134; 333/202; 333/205

(58) Field of Search ................................ 333/17.1, 134, 333/188, 193, 195, 202, 205, 207, 209, 223, 231, 235, 132

(56) References Cited

U.S. PATENT DOCUMENTS

| | | | |
|---|---|---|---|
| 6,018,282 A | 1/2000 | Tsuda | 333/205 |
| 6,085,071 A | 7/2000 | Yamada et al. | 455/82 |
| 6,307,448 B1 | 10/2001 | Atokawa et al. | 333/202 |

FOREIGN PATENT DOCUMENTS

| | | |
|---|---|---|
| EP | 0 813 310 | 12/1997 |
| EP | 0 980 109 | 2/2000 |
| GB | 2 266 206 | 10/1993 |
| JP | 7-58597 | 3/1995 |
| JP | 8-172333 | 7/1996 |
| JP | 11-243304 | 9/1999 |
| JP | 2000-59104 | 2/2000 |
| JP | 2000-312161 | 11/2000 |
| JP | 2000-353972 | 12/2000 |

*Primary Examiner*—Barbara Summons
(74) *Attorney, Agent, or Firm*—Wenderoth, Lind & Ponack, L.L.P.

(57) ABSTRACT

A high-frequency filter device includes at least one filter to be connected to a high-frequency stage of a wireless apparatus. The filter includes a voltage-controlled variable frequency resonance element which is made of a resonance element and a voltage-controlled variable impedance element electrically connected to the resonance element. The high-frequency filter device includes a control section for controlling a voltage applied to the variable impedance element, and a signal monitoring section for outputting a control signal, with which the voltage is controlled, to the control section based on frequency data as to an oscillating frequency of a local oscillator of the wireless apparatus. The signal monitoring section controls a band frequency of the at least one filter based on the frequency data in such a manner that the band frequency is adaptively changed.

4 Claims, 11 Drawing Sheets

HIGH-FREQUENCY FILTER DEVICE, FILTER DEVICE COMBINED TO A TRANSMIT-RECEIVE ANTENNA, AND WIRELESS APPARATUS USING THE SAME

This application is a divisional of Ser. No. 09/964,691, filed Sep. 28, 2001, now U.S. Pat. No. 6,577,205.

BACKGROUND OF THE INVENTION

1. Field of the Invention

The present invention relates to an adaptive high-frequency filter device to be used primarily in a high-frequency section of wireless apparatuses such as cellular telephones, an adaptive filter device combined to a transmit-receive antenna, and a wireless apparatus using those devices.

2. Prior Art

In recent years, it has been practiced that in simultaneous two-way wireless communication apparatuses such as cellular telephones and car telephones used in cellular wireless communication systems, a filter device is provided between a transceiver and its antenna. In this wireless communications system, available frequency bands are assigned to a transmitting frequency band and a receiving frequency band, and the filter device is equipped with, on the receiver side, a filter device that allows the passing of a receivable frequency band and, on the transmitter side, a filter device that allows the passing of a transmittable frequency. In communications apparatuses for use in this system, in recent years, there have been exploited frequency-shift type filter devices in which each of a frequency band for reception use and a frequency band for transmission use is divided into two so that the filter device is enabled to switch between the divided smaller frequency bands.

Japanese Patent Publication No. 11-243304 discloses an example of filter devices of frequency-shift type. As shown in FIG. 9, this filter device comprises a receiving filter device and a transmitting filter device which are combined at a single antenna terminal and connected in series. In the combined filter device, the transmitting filter device has its transmitting terminal 94 connected to a final stage of the transmitter, the receiving filter device has its receiving terminal 95 connected to a high-frequency stage of the receiver, and an antenna terminal 96 is connected to a common-use antenna circuit.

Each filter device of the combined device is formed of two- or three-stage filters, each of which includes a dielectric resonator 91 which is, in common, grounded at one end, where a capacitance 93 is connected in parallel to the dielectric resonator 91 via a PIN diode switch 92 which turns on or off the parallel capacitance 93 to switch the resonance frequency.

The filter device, generally, includes a band pass filter and a band elimination filter. In one of the band elimination filters as shown in FIG. 9, an input or output terminal is connected to a notch coupling capacitance 97 and a resonator 91 in series, the resonator being grounded, and also to a loading capacitance 99 being grounded, while the input terminal is connected to an output terminal via an interstage coupling inductor 98. For the makeup of a filter device including multi-stage filters, these filters are connected in series, each having a different resonating frequency.

In the other band pass filter, input and output ends are made up so that an inter-stage coupling capacitance 910 and an input-output coupling inductor 911 are connected in series, and that the resonator 91 having one end grounded is connected to this capacitance 910 and inductor 911. A branch coupling capacitance 912 is connected between the input and output ends in a parallel fashion. These filters are connected in series to make up a multi-stage band pass filter.

These two filter devices (i.e., transmitting filter device and receiving filter device) are connected in series at an antenna terminal, sharing the antenna terminal. For connection to a common antenna used in a simultaneous transmit-and-receive apparatus, the filter devices are connected to the antenna terminal via an L-type matching circuit of an inductor 913 and a capacitance 914 for matching purposes, thus forming a filter device for common use of both transmitter and receiver of the above apparatus.

In such a frequency-shift type filter device for common use with a high-frequency antenna, the dielectric resonator 91 is provided with the capacitor 93 in parallel via the PIN diode switch 92 as shown in FIG. 9, wherein the resonance frequency of the resonator 91 can be selectively switched between a low frequency f1 and a high frequency f2 by electrically turning on and off the PIN diode switch 92. In the example shown in FIG. 9, the receiving filters and the transmitting filters each use a resonator changeable resonance frequency. One filter device generally uses two or more filters for switching their respective resonance frequencies, resulting in switching the center frequency of the filter band.

This filter device has advantages so as not to be necessary to lower the pass loss throughout the whole passband, or to increase the attenuation ratio throughout the whole attenuation band. Therefore, each of the two filter devices are only required to cover a half of the whole band, thereby reducing the burden of the filter device. That is, this can exhibit the same effect, apparently, as the transmit and receive frequency gap of the filter expanded by a half of the entire passband.

Japanese Patent Publication No. 2000-312161 discloses the concept that a wireless apparatus changes the attenuation amount of the filter depending on nations or regions where the apparatus is used by detecting positional information with other communication means such as signals transmitted from a base station or GPS.

In the above filter devices, to decrease the burden of the filter with attenuation characteristics covering the whole bandwidths for transmission and reception in a communication system, the filter characteristics are changed to be applicable to the communication frequency bands that are differently allotted for the country in which the wireless apparatus is used.

Further, FIG. 10 shows a structure of an actual prior-art wireless apparatus, such as a portable cellular telephone, including filter devices for a transmit-receive antenna. The apparatus includes a semiconductor integrated circuit 103 provided with a wireless circuit, a filter device 101 which is connected to the semiconductor integrated circuit 103, and an internal antenna 102 which is coupled to a dielectric filter device 101, these being mounted on, or formed in, a printed circuit board 104, and an external antenna 106 is also provided which is connected to the filter devices 101. This wireless apparatus is large in number of parts, difficult to manufacture, and also occupied in great deal by the wireless section.

The prior art filter devices have only been capable of changing the filter band frequency, alternatively and simply, to either one of two frequency passbands, subordinate to frequency selection of transmitting signals and received signals.

The technique of changing the attenuation amount based on detected positional information has not provided sufficient characteristics for the filter.

Further, the wireless apparatuses for simultaneous bi-directional wireless communication have been insufficient to protect against interfering waves other than an under-reception target signal under actual wave environments in which the wireless apparatus is used, as well as to suppress spurious signals issued by the apparatus itself during signal transmission. Thus, the characteristics of antenna-coupled filters are required to be changed adaptively in response to the change of wave environments around, and the operating state of, the wireless apparatus in use.

In order to completely prevent such interfering waves and unnecessarily radiated waves, the conventional filter devices in which passband frequencies are fixed had to involve ultra-high filtering performance characteristics, necessitating multi-stage high-Q resonators, in which case the filter devices would be required to have a large size. Downsizing the resonators to downsize the filter device would cause the high-frequency characteristics to deteriorate, not obtaining practical, required characteristics.

Furthermore, from the viewpoint of the configuration of parts in such actual filters mounted, filter devices have been difficult to manufacture because of the large number of component parts, which occupy quite a large area of the wireless section.

SUMMARY OF THE INVENTION

An object of the present invention is to provide an adaptive high-frequency filter device that is small in size and high in performance and is capable of adaptively changing and controlling the frequency characteristics of filters according to ambient wireless environments or the operating state of the wireless apparatus.

Another object of the invention is to also provide a high-frequency filter device in which component parts constituting the filter device are integrated by using multilayer techniques.

The present invention further provides a wireless apparatus being integrated with a filter device to be downsized.

The high-frequency filter device of the present invention includes at least one filter to be connected to a high-frequency stage of a wireless apparatus, the at least one filter comprising a voltage-controlled variable frequency resonance element which comprises a resonance element and a voltage-controlled variable impedance element electrically connected to the resonance element. The high-frequency filter device includes a control section for controlling a voltage applied to the variable impedance element, and a signal monitoring section for outputting a control signal, with which the voltage is controlled, to the control section based on frequency data as to an oscillating frequency of a local oscillator of the wireless apparatus. The signal monitoring section controls a band frequency of the at least one filter based on the frequency data in a manner such that the band frequency is continuously varied.

In the filter device of the invention, the resonance element may be a distributed-constant TEM mode resonator. Preferably, the resonance element is implemented by a stripline resonator arranged in a laminate dielectric or on a surface thereof In this apparatus, the voltage-controlled variable impedance element is a variable capacitive or inductive element, preferably, a variable capacitance circuit, and particularly preferably, a circuit using a varactor diode.

The variable frequency resonator may be made up by connecting in parallel a stripline resonator and a varactor diode for controlling by a variable voltage signal, an additional, variable capacitance to be added to the resonator, and then controlling the band frequency of the filter.

In the present invention, the high-frequency filter device may include at least one band pass filter using the variable frequency resonator. The filter device may, also, include at least one band elimination filter using the variable frequency resonator. The filter device may further include a combination of a band pass filter and a band elimination filter.

In the high-frequency filter device of the invention, the signal monitoring section variably controls the band frequency of the at least one filter based on the frequency data so that a passband of the filter can include a pass frequency of the high-frequency stage of a receiver and/or a transmitter in the wireless apparatus.

It is also possible that the signal monitoring section further detects radio signals toward and/or from an ambient wave environment around the wireless apparatus and transfers a control signal to the control section so that the at least one filter reduces unnecessary or interfering waves, and that the control section generates a control voltage signal to variably control the band frequency of the at least one filter.

The wireless apparatus using the filter device of the present invention may include a transmitter and/or a receiver. When the wireless apparatus includes at least a receiver, the at least one filter is connected between a high-frequency amplifying stage of the receiver and an antenna, and the at least one filter includes a band pass filter for reception and a band elimination filter for reception. The signal monitoring section for reception monitors unnecessary interfering signals in the received signals by the wireless apparatus and generates a control signal for reception by an adaptive control algorithm. The control section controls the band elimination filter by a control voltage signal based on the control signal so that an elimination band of the band elimination filter maximizes a ratio of a desired received signal to interfering waves.

When the wireless apparatus includes a transmitter, the at least one filter of the high-frequency filter device includes a band pass filter for transmission and a band elimination filter for transmission, the signal monitoring section for transmission, while monitoring unnecessary spurious signal waves of a transmitting signal of the wireless apparatus, generates a control signal by an adaptive control algorithm, and the control section for transmission controls the band elimination filter by a control voltage signal based on the control signal so that an elimination band of the band elimination filter for transmission minimizes unnecessary spurious waves included in the transmitting signal.

The filter device, combined with a transmit-receive antenna, comprises a high-frequency filter device for transmission including transmitting filters to be connected between the transmit-receive antenna and a transmitter of a wireless apparatus, and a high-frequency filter device for reception including filters to be connected between the antenna and the receiver, wherein the transmit-receive filters include the respective voltage-controlled variable-frequency resonance elements, each of which comprises a resonance element and a voltage-controlled variable impedance element electrically connected to the resonance element. The filter device for a transmit-receive antenna includes a control section for controlling a voltage applied to the variable impedance elements, and a signal monitoring section for outputting a control signal, with which the voltage is controlled, to the control section based on frequency data as to an oscillating frequency of a local oscillator of the wireless apparatus, and the signal monitoring section controls band frequencies of the transmitting filter and the receiving filter based on the frequency data in a manner such that the band frequencies are continuously varied.

In such a filter device for a transmit-receive antenna, the transmitting filter has a first passband and a first elimination band, and the receiving filter has a second passband and a second elimination band. The signal monitoring section controls the first passband and the first elimination band so that their band frequencies are synchronously varied with their frequency interval kept constant, and controls the second passband and the second elimination band so that their band frequencies are synchronously varied with their frequency interval kept constant. Further, the first passband and the second elimination band become generally coincident with each other and the first elimination band and the second passband become generally coincident with each other.

In such a high-frequency filter device for a transmit-receive antenna, the signal monitoring section further detects a radio signal toward and/or from an ambient environment of the wireless apparatus and transfers a control signal to the control section so that the at least one filter reduces unnecessary or interfering waves, and the control section generates a control voltage signal to variably control the band frequency of the at least one filter.

In the high-frequency filter device for a transmit-receive antenna, the signal monitoring section monitors unnecessary interfering signals of a received signal of a receiver of the wireless apparatus and generates a control signal for reception by an adaptive control algorithm, and the control section controls the band elimination filter by a control voltage signal based on the control signal so that an elimination band of the band elimination filter of the receiving filter maximizes a ratio of a desired received signal to interfering waves.

Also, the signal monitoring section, while monitoring unnecessary spurious signals of a transmitting signal of a transmitter of the wireless apparatus, generates a control signal for transmission by an adaptive control algorithm, and the control section for transmission controls the band elimination filter by a control voltage signal based on the control signal so that an elimination band of the band elimination filter for transmission minimizes unnecessary spurious signal waves of the transmitting signal.

The present invention further includes a wireless apparatus which includes the high-frequency filter as described above, wherein the at least one filter is connected to an antenna circuit.

The present invention also includes a wireless apparatus which includes the filter device for a transmit-receive antennas as described above.

The high-frequency filter devices and the filter devices for transmit-receive antennas according to the present invention are used at relatively high frequency regions, for example, RF and microwave bands of frequencies higher than the shortwave band. Such wireless apparatuses can suitably be applied to, not only receivers and transmitters of the one-way communications system, but also transceivers for the simultaneous two-way communications system, in particular, portable telephones in the cellular communications system.

BRIEF DESCRIPTION OF THE DRAWINGS

The present invention will be described in detail below with reference to the accompanying drawings, in which.

DETAILED DESCRIPTION OF THE PREFERRED EMBODIMENTS

Embodiment 1:

A high-frequency filter device of this embodiment is connected between a wireless apparatus and an antenna thereof. The high-frequency filter device includes a filter capable of changing in filtering band frequencies, a control section for controlling the variable-frequency resonator and a signal monitoring section to control the control section according to the information from the wireless apparatus.

The filter in the high-frequency filter device in the present invention includes a voltage-controlled variable frequency resonator element composed of a resonator element and a voltage-controlled variable impedance element provided in parallel to the resonator element, where a voltage applied to the variable impedance element is controlled through the control section by the signal monitoring section based on the information derived from the wireless apparatus, whereby the frequencies of the filter are changeably controlled.

The signal monitoring section may generate a control signal adaptively based on information concerning the oscillating frequency of a local oscillator mounted in the wireless apparatus connected to the filter device. Then, based on the control signal, the control section supplies a control voltage signal to the resonator to control the frequency characteristics of the filter variably and adaptively. As a result of this, the frequency characteristics of the filter device are adaptively changed and controlled according to the operating state of the wireless apparatus.

In particular, the filter device includes a band pass filter and a band elimination filter, where according to the ambient radio environments and the information as to the oscillating frequency of the local oscillator in the wireless apparatus on which the filters are mounted, the signal monitoring section generates a control signal for adaptively controlling the frequency characteristics of the individual filters so that optimum frequency characteristics of the filters can be obtained, and transfers the control signal to the control section to generate a control voltage signal, thereby adaptively controlling the frequency characteristics of the filters.

Figure 1:
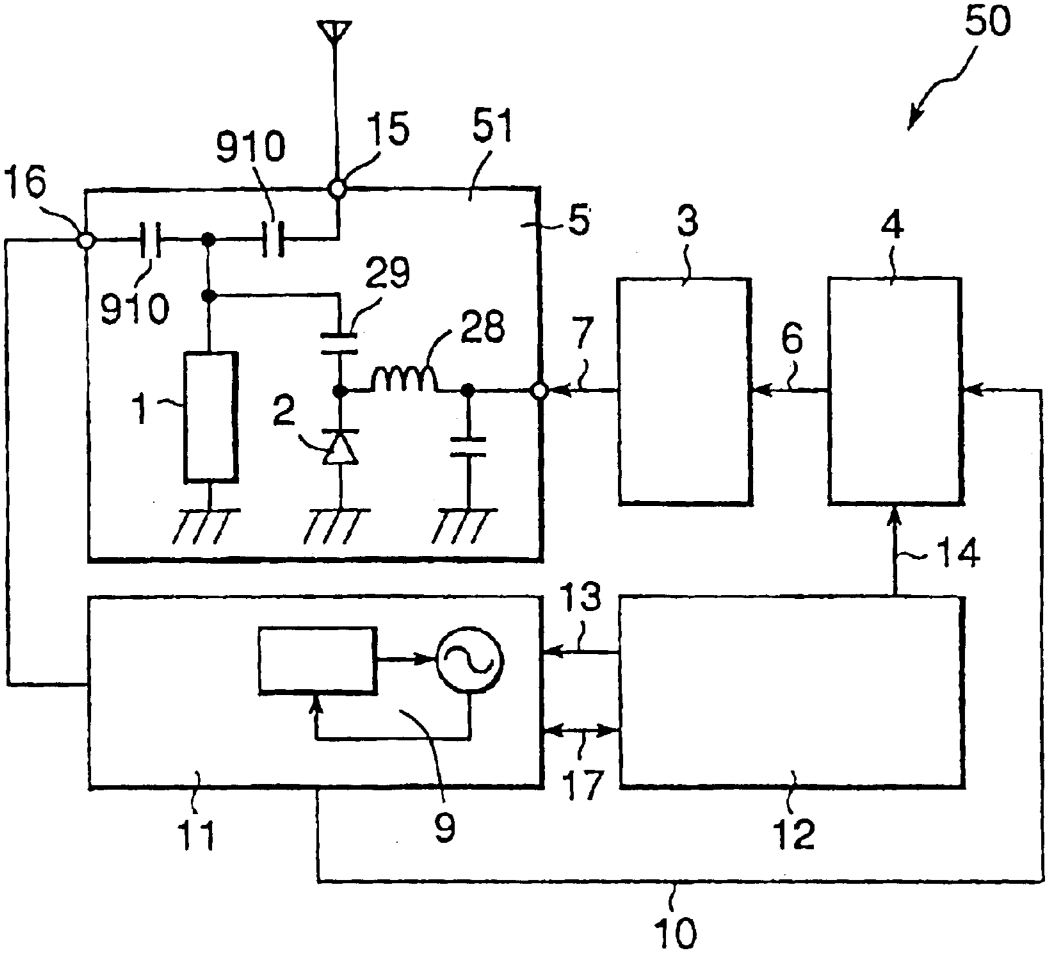
FIG. 1 is a circuit block diagram of an adaptive high-frequency filter according to an embodiment of the invention.

FIG. 1 shows a circuit block diagram of an adaptive high-frequency filter device 50 using a band pass filter 51, giving an example in which a single filter is used. Referring to FIG. 1, a filter 5 has a variable-frequency resonator connected at an intermediate point of two coupling capacitors 910 and 910 in series between terminals 15 and 16, with the other end grounded. The voltage-controlled variable frequency resonator is made up of a resonator element 1 and a voltage-controlled variable impedance element 2, which are connected in parallel through a coupling capacitor 29, where a voltage control terminal is connected to the variable impedance element 2 via a choke coil 28.

This filter device 50 is comprised of the above filter 5, a control section 3 connected to the voltage control terminal, and a signal monitoring section 4 for feeding a control signal to the control section 3.

The filter device 50 can be used as its one end 16 is connected to a wireless apparatus 11 and the other end 15 is connected to the antenna, where the signal monitoring section 4 is used as connected to the wireless apparatus 11. The signal monitoring section 4 differs in the contents of control over the filter device depending on the wireless apparatus 11 to which the filter device 50 is connected, as well as the properties of the wireless apparatus.

Figure 2:
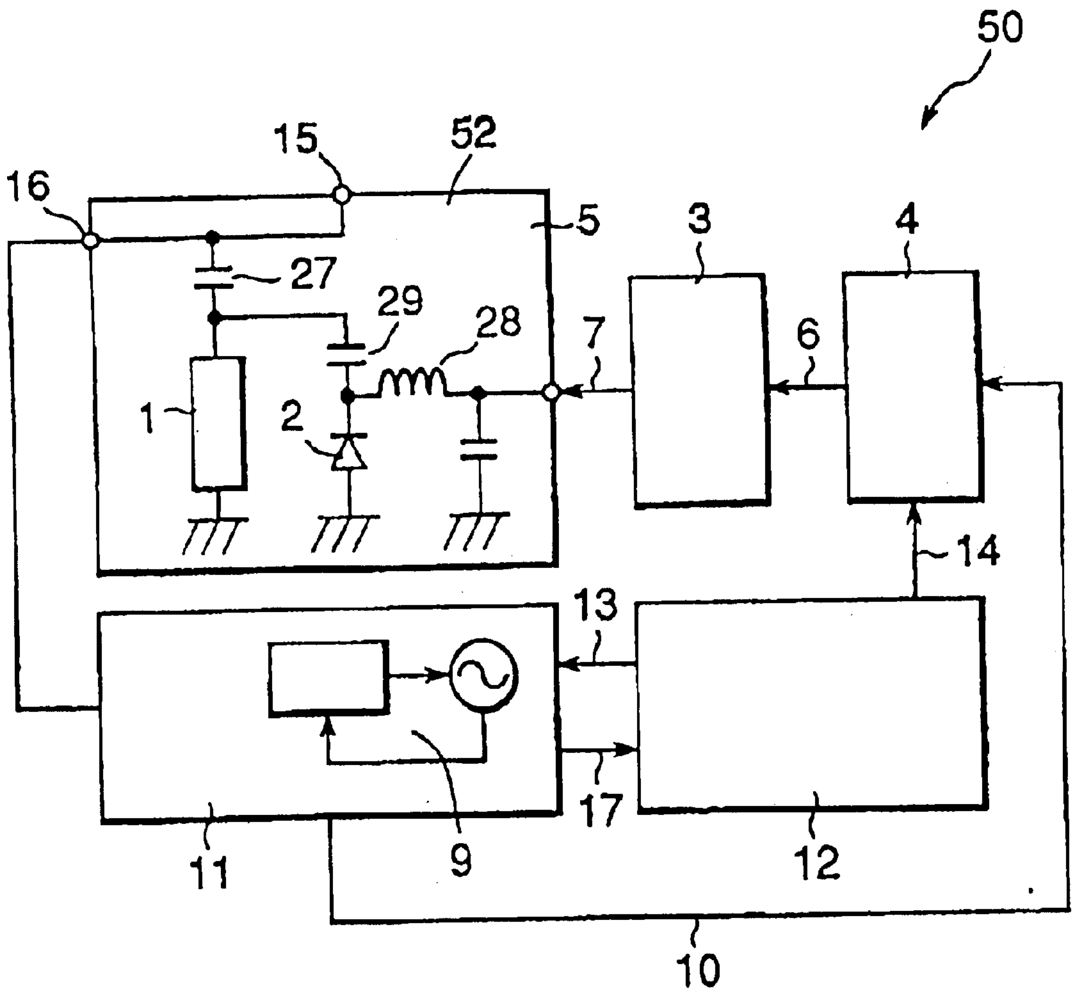
FIG. 2 is a circuit block diagram of an adaptive high-frequency filter which is another modification of the embodiment of the invention.

FIG. 2 shows a circuit block diagram of an adaptive high-frequency filter device 50 using a band elimination filter 52, giving an example in which a single filter 5 is used. Referring to FIG. 2, the filter 5 has a variable frequency resonator coupled in series via a notch coupling capacitor 27 between both terminals 15 and 16, with the other end of the resonator grounded, then constituting a band elimination filter 52. The voltage-controlled variable frequency resonator is made up of a resonator element 1 and a voltage-controlled variable impedance element 2, which are connected in parallel, where a voltage control terminal is connected to the variable impedance element via a choke coil.

This filter device 50 is comprised of the above filter, a control section connected to the voltage control terminal, and a signal monitoring section for feeding a control signal to the control section. Actually, a filter device is comprised of a plurality of filters, one or more control sections corresponding to the filters, and generally one signal monitoring section.

The filter device can be used as its one end is connected to the wireless apparatus and the other end is connected to the antenna, where the signal monitoring section is used, as connected to a wireless apparatus, so as to control the band frequency and bandwidth of the whole filter device based on information as to the wireless apparatus. The signal monitoring section differs in the contents of control over the filter device depending on the wireless apparatus to which the filter device is connected, as well as the properties of the wireless apparatus. The filter device is divided into a filter device for a receiver and a filter device for a transmitter. The high-frequency filter device is generally connected between a communications apparatus and an antenna, but may also be used as an inter-stage filter which is disposed between high-frequency stages of the receiver or the transmitter. To be used as an inter-stage filter, the terminal 15 of the filter 5 shown in FIGS. 1 and 2 may be connected to a high frequency stage of the wireless apparatus, for example, such as the end front amplification stage of the receiver or the high frequency power amplification of the transmitter which is connected to an antenna.

The filter device for a transmit-receive antenna, including a receiving filter device and a transmitting filter device, is used for simultaneous two-way wireless communication devices, i.e., transceivers.

With respect to the filter device for receivers, in FIG. 1, a local oscillator 9 is provided in the wireless section, where the reception frequency for the wireless apparatus 11 is set to the variable frequency of this local oscillator. This local oscillating frequency is controlled by a frequency control signal 13 which is generated at a baseband section 12 (which treats frequency bands of transfer of such information as audio and data in electrical communications).

In this embodiment, to the signal monitoring section, information relating to a received signal is transferred as a frequency information signal 14 from the baseband section 12. A monitor signal 10 is also transferred to the signal monitoring section from a wireless section 11. This monitor signal 10 contains a strength of a received high-frequency signal, an S/N ratio of a demodulated signal, a bit error rate and other information.

Also, there is a transmit-receive baseband signal 17 for exchanging information between the wireless section 11 and the baseband section 12.

In this embodiment of the present invention, the signal monitoring section 4, provided in the wireless apparatus 11, makes a control voltage signal 7 generated at the control section 3 according to a control signal 6 outputted from the signal monitoring section 4 so as to adaptively control the band frequency of the voltage-controlled variable frequency resonator.

In this embodiment, the frequency information signal 14 and the monitor signal 10 are given to the signal monitoring section 4, and the signal monitoring section 4 computes the control signal 6 by an adaptive control algorithm based on the given information, outputting the control voltage signal 7 from the control section 3.

The adaptive control algorithm offers, for example, a method of optimally filtering a received signal received by the receiver as follows.

In simultaneous bi-directional transmit-receive systems such as cellular telephone systems, it is commonly practiced that a transmission signal contains a certain signal sequence predetermined for each transmission signal to allow the signal synchronization and discrimination, where the signal sequence is transmitted first from a base station toward terminals or from a terminal transceiver toward the base station.

These signals, which have already been known to each wireless apparatus, are used as training signals. That is, in the receiver, a replication of the transmission signal is generated inside the wireless apparatus. A cross-correlation coefficient of this transmission signal and the actually received reception signal are determined. The smaller the cross-correlation coefficient becomes, the more the received signal is a signal other than the signal sequence, i.e., an interfering wave. On the other hand, the larger the cross-correlation coefficient becomes, the more the received signal is a signal containing the target transmission signal to be received. By sequentially computing the cross-correlation coefficient during the signal reception, the frequency of the passband or elimination band of the receiving filter device is changed so that the cross-correlation coefficient is maximized, by which interfering signals are suppressed, the signal strength of the target received signal is maximized and therefore, the signal to interfering wave ratio can be maximized.

The maximum point of the signal to interfering wave ratio can be determined by various methods. One available method is a perturbation method in which the control voltage signal given to the voltage-controlled variable frequency resonator 1 is varied by infinitesimal amounts at random, changing the band frequency of the filter device, by which the direction of the maximum value of cross-correlation coefficient is determined.

Another method includes defining shifts of cross-correlation coefficient values from the maximum value as an evaluation function, and deriving a derived function of the evaluation function with respect to the band frequency of the filter device, thereby allowing a minimum point to be determined. Because the receiver has no preliminary knowledge of a portion corresponding to a true transmission signal, cross-correlation coefficient values corresponding to the portion result in errors, but weighting can be done by paying particular attention to already-known signal portions. Since an obvious difference in the cross-correlation coefficient value between a target signal and an interfering signal comes out, this method can be said to be a sufficiently effective method.

Figure 4A:
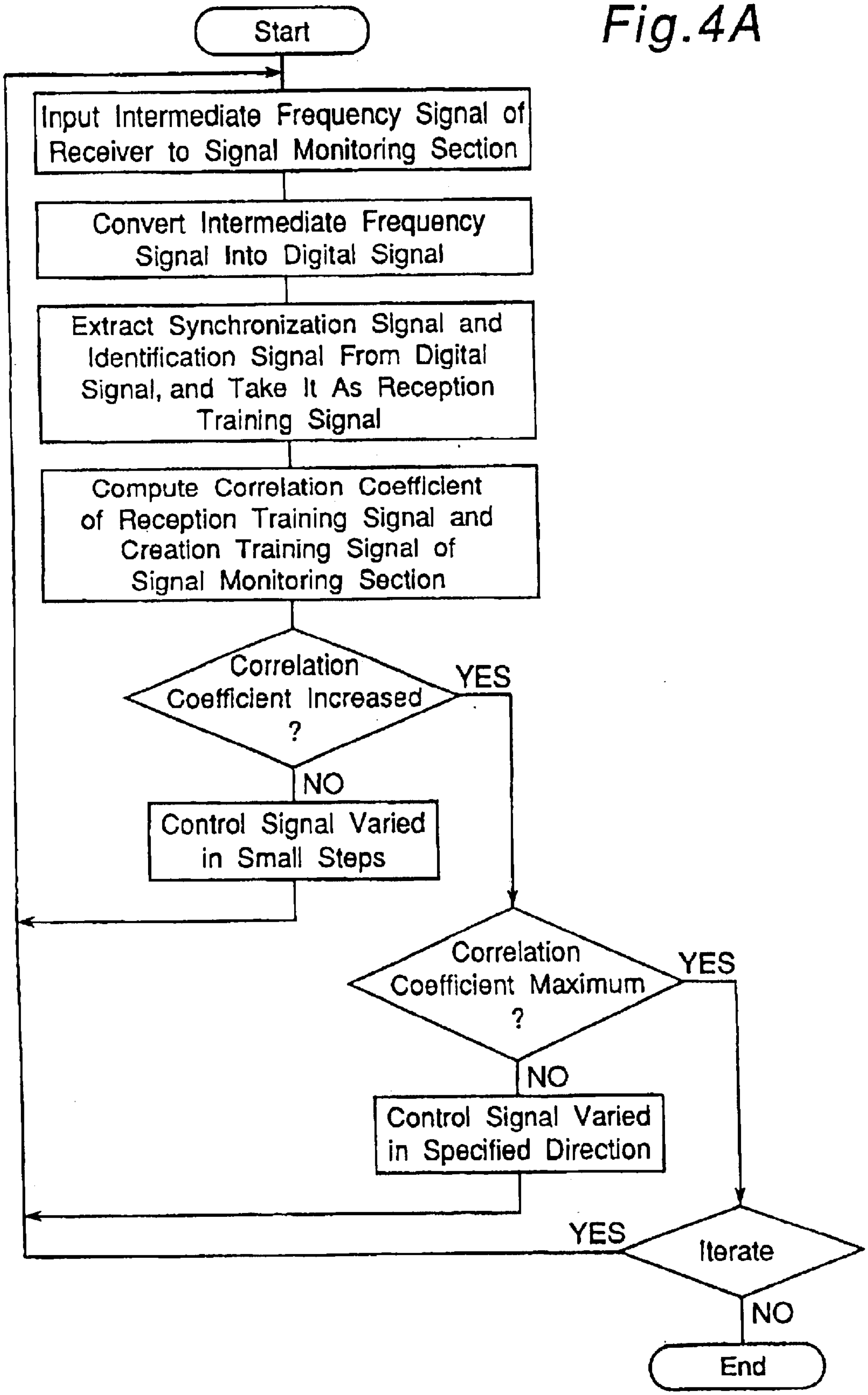
FIG. 4A is a flowchart for explaining an adaptive algorithm in a receiver.

An example of the adaptive control algorithm is shown in FIG. 4A, where the signal monitoring section operates as follows:

1. The signal monitoring section receives an input of an intermediate frequency signal from the receiver.
2. The signal monitoring section converts the intermediate frequency signal into a digital signal, extracts a synchronization signal and an identification signal and utilizes those extracted signals as a received training signal.
3. The signal monitoring section creates a training signal from its own synchronization signal and identification signal and outputs a reference training signal.
4. The signal monitoring section computes the correlation of the received training signal and the reference training signal.
5. The signal monitoring section makes the voltage control signal changed in small steps while monitoring the changes of the correlation coefficient value, and makes the voltage control signal changed in such a direction that the correlation coefficient value increases.
6. The signal monitoring section decides whether or not the correlation coefficient value is a maximum, where if a maximum value is obtained, then a voltage control signal is held. If the maximum value is vary large, the signal is a signal to be received; and if the maximum value is close to zero, the signal is a non-matching signal or an interfering signal.
7. The signal monitoring section executes these operations periodically.

For the transmitter, it is relatively easy to achieve optimum filtering characteristics for a transmitting signal. Because the transmitter has preliminary knowledge of an ideal transmitting signal, unnecessary spurious transmission signals can be suppressed by maximizing the cross-correlation coefficient of a transmission signal and a monitor signal obtained from, for example, the output terminal 15 while minimizing the total transmission signal.

The monitor signal 10 can be outputted from the wireless section 11 as shown in FIG. 1. The monitor signal 10 may be given by a signal branched from a signal branching device (not shown) which is connected outside the terminal 15 of the filter. With such a constitution, outside radio environments can be known more accurately, thus allowing an excellent frequency characteristic of the filter to be achieved.

Figure 4B:
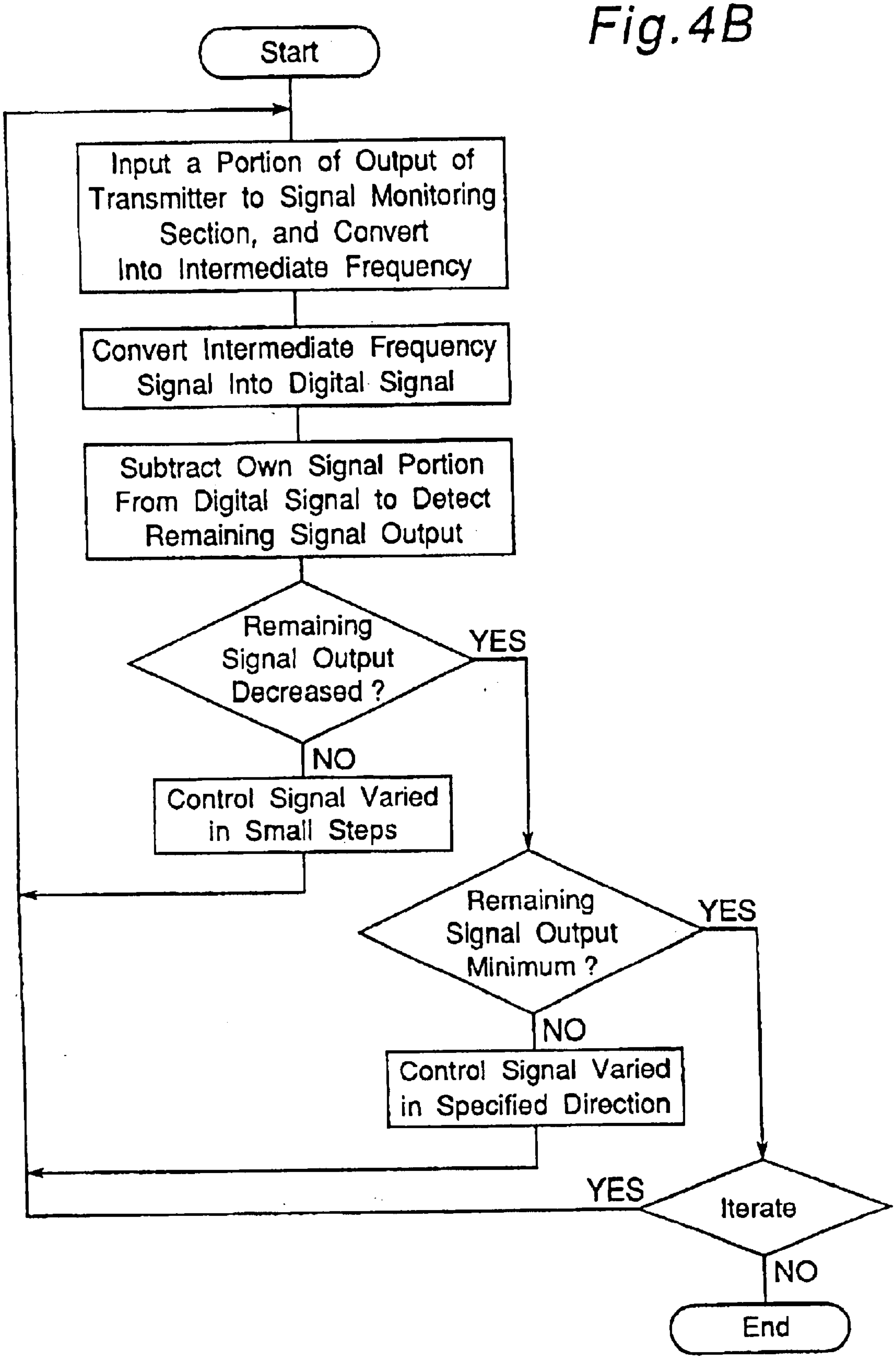
FIG. 4B is a flowchart for explaining an adaptive algorithm to be used by a transmitter.

An optimization algorithm on the transmission side is shown in FIG. 4B, where 1. A portion of a transmission output to the antenna is inputted to the signal monitoring section and converted into an intermediate frequency.
2. This intermediate frequency signal is converted into a digital signal.
3. The intermediate frequency of its own baseband is subtracted from the intermediate frequency signal to detect an output of a remaining signal.
4. The voltage control signal is changed in small steps, making it decided whether or not the output of the remaining signal is a maximum.
5. If a minimum point of the remaining signal is found out, the point is a point where unnecessary radiation is minimized.
7. The signal monitoring section executes these operations periodically.

Figure 3A:
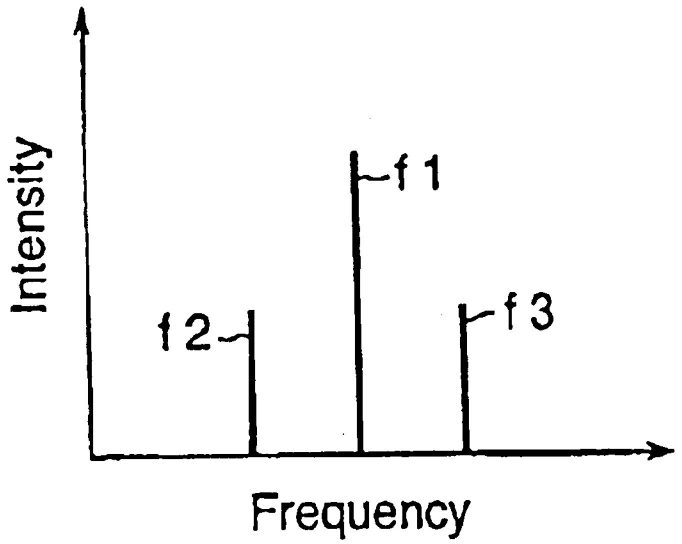
FIG. 3A shows a relationship between frequency and receiving-signal strength for explaining the operation of the adaptive high-frequency filter of Embodiment 1 of the invention.

With respect to the receiving filter device, its frequency characteristics are illustrated in FIG. 3A. Frequencies relating to reception include an internal local signal f1, an image frequency signal f2 and a reception frequency signal f3. The receiver needs only the reception frequency signal f3, and the filter device permits only the received signal frequency f3 to pass therethrough and attenuates the internal local signal f1 and the image frequency signal f2. In the case of a low intermediate frequency, narrow intervals between the individual frequencies are involved and therefore, the filter device is required to have vary abrupt filter characteristics, thus having a large insertion loss. In other words, to meet this requirement, filters of quite a large size and configuration would be required. Normally, the received signal has a specific frequency bandwidth. Therefore, when the bandwidth is considerably large for the intermediate frequency, a frequency interval between passband and attenuation band at the nearest end would be further narrower, increasingly burdening the filters.

Figure 3B:
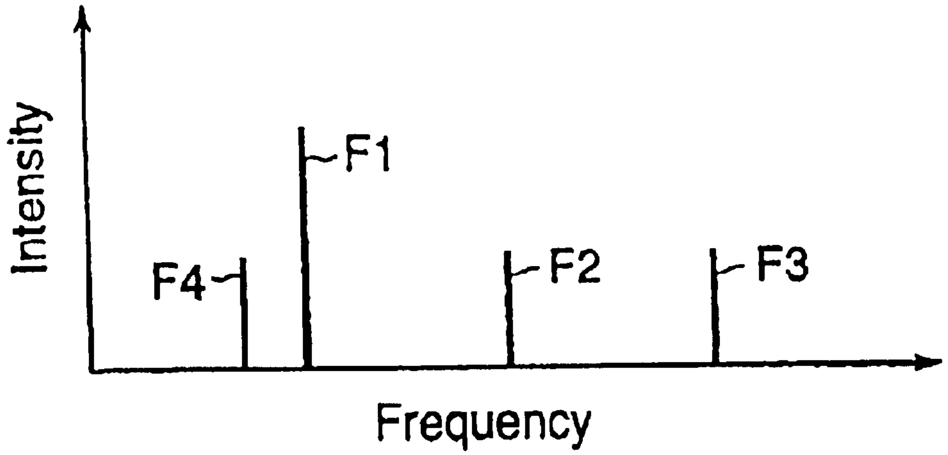
FIG. 3B shows a relationship between frequency and transmitting-signal strength for explaining the operation of the adaptive high-frequency filter of Embodiment 1 of the invention.

Frequency characteristic of this transmitting filter device are disclosed in FIG. 3B. An emission electric field from the transmitter includes a transmission frequency signal F1, a second harmonic F2, a third harmonic F3 and other spurious signals F4. The transmitter should radiate only the transmission frequency signal F1. The filter device should pass only the transmission signal frequency F1 and attenuate the harmonics F2, F3 and spurious signals F4. Since the frequencies of the spurious signals can be predicted from the oscillating frequency of the local oscillator 9, the signal monitoring section 4 can compute the control signal 6 based on those pieces of information.

With the constitution of the present invention, the filter device ensures, as a pass frequency signal, only frequencies that should truly be passed sequentially, and the signal monitoring section adaptively controls the frequency characteristics of the filters so that the attenuation is ensured only at frequencies where a signal to be attenuated is actually present. Therefore, the filter device is only required to have a least number of necessary resonators and an unloaded Q value, thus capable of obtaining excellent filtering characteristics while the filters are reduced in size and suppressed in insertion loss.

Referring to the aforementioned problem, in other words, it has been the case with conventional filters that frequency regions in which desired signal groups can be present are all taken as passbands while frequency regions where interfering signals or spurious signals can be present are all taken as attenuation bands. This point applies also to both frequency-shift type filter devices for transmit-receive antennas, which have been referred to as a prior-art example, and positional-information detection type filter devices for transmit-receive antennas. In contrast to this, the filter device of the present invention has only to pass the frequency of a target signal that is intended for actual reception or transmission, and attenuate only the frequency of interfering signals and spurious signals associated with this target signal. Thus, the filter device is allowed to set a passband to the target signal and necessary least attenuation poles for interfering signals and spurious signals by controlling the frequency of each filter. This can be achieved by a small-size filter device.

Whereas the frequency information signal 14 and the monitor signal 10 are normally inputted to the signal monitoring section 4, there is another more convenient method in which the frequency of the filter device to be adaptively controlled with only the frequency information signal 14 inputted. This method, indeed somewhat inferior in terms of optimization of filtering characteristics to the foregoing wireless apparatus, can be kept less complex in circuit scale and improved in performance over the conventional high-frequency filters and wireless apparatuses. In particular, in the transmitting filter device, which has knowledge of its own transmitting frequency and local oscillation frequency, harmonics and spurious signals can be automatically determined, and therefore, frequency control of the filter device can be achieved relatively easily without using the monitor signal 10.

Embodiment 2:

In this embodiment, the filter device for a transmit-receive antenna includes two high-frequency filter devices. A first filter device, i.e., a filter device for reception, has a first passband and a first elimination band. A second apparatus, i.e., a filter device for transmission, has a second passband and a second elimination band. The passbands and elimination bands are controlled so that the first passband and the second elimination band generally coincide with each other while the first elimination band and the second passband generally coincide with each other. Yet, the first passband and the first elimination band are constant in frequency interval and change in synchronization, while the second passband device second elimination band are also constant in frequency interval and synchronized with each other.

In this embodiment, with respect to the first filter device, which is for reception use, the signal monitoring section therefor, while observing unnecessary interfering signals of the received signal of the wireless apparatus, generates a control signal by the adaptive control algorithm and the control section generates a control voltage signal according to the control signal so as to suppress any interfering signals by adaptively changing the frequency of the band elimination type filter. As a result of this, the elimination band of the band elimination filter can maximize the ratio of a desired received signal to interfering waves.

In the second filter device, which is for transmission use, the signal monitoring section, while observing unnecessary spurious signal waves of the transmitting signal of the wireless apparatus, generates a control signal by the adaptive control algorithm, and the control section adaptively changes and controls the frequency characteristics of the filter with a control voltage signal according to the control signal. The elimination band of the band elimination filter minimizes unnecessary spurious signal waves in the transmitting signal.

Thus, even if the reception frequency and the transmission frequency are changed at each communication, the transmitter can transmit a specified frequency by reducing spurious radiation as much as possible, while the receiver can receive a specified reception frequency under optimum conditions while intercepting the interfering waves. Moreover, this filter device for a transmit-receive antenna can meet even abrupt changes in radio environments such as interfering waves during communications, as the case may be, so that the signal-to-interfering wave ratio can be maintained to the best state at all times.

Figure 5:
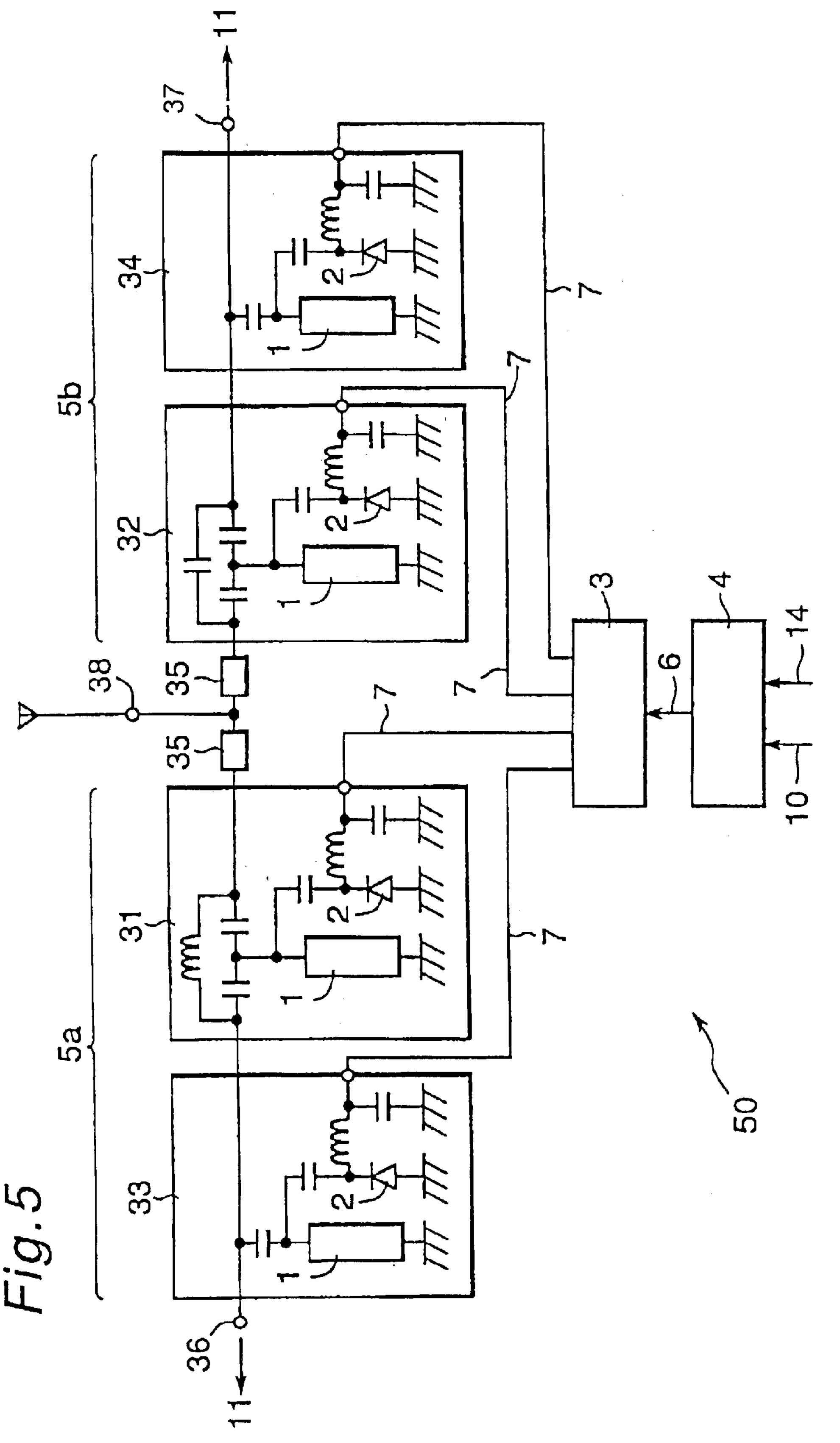
FIG. 5 shows a circuit block diagram of a filter device for a transmit-receive antenna according to another embodiment of the invention.

The filter device for transmit-receive antennas according to this embodiment is shown in FIG. 5.

In this filter device for transmit-receive antennas, a filter device for reception use and a filter device for transmission use are connected to each other at an antenna terminal 38 connected to a common antenna, and a receiving terminal 36 is provided on the receiving filter device side while a transmitting terminal 37 is provided on the transmitting filter device side.

The receiving filter device 5*a* is made up of a band elimination filter 33 and a band pass filter 31 with an upper attenuation pole, the two filters being connected in series. The transmitting filter device 5*b*, on the other hand, includes a band elimination filter 34 and a polarized band pass filter 32 with a lower attenuation pole, the two filters being connected to each other. The filter devices 5*a*, 5*b* have impedance/phase adjustment elements 35, 35 connected to the antenna terminal 38 in series, respectively.

These filters 31–34 are all variable in band frequency, with the filters 31 and 32 synchronously controlled and the others controlled independently of one another, by voltage control, each filter having a voltage control terminal connected to the control section, and the control section being connected to the signal monitoring section. Upon reception of the monitor signal 10 and the frequency information signal 14, a control signal derived from the signal monitoring section 4 is fed to the control section 3, and the control section gives individual control voltage signals 7 to the filters 31–34, respectively.

In this embodiment, a low frequency band is allocated to the received signal and a high frequency band is allocated to the transmitting signal. In the case of an inverse frequency allocation, the terminal 36 serves as a terminal for the transmitter and the terminal 37 serves as a terminal for the receiver.

Figure 6:
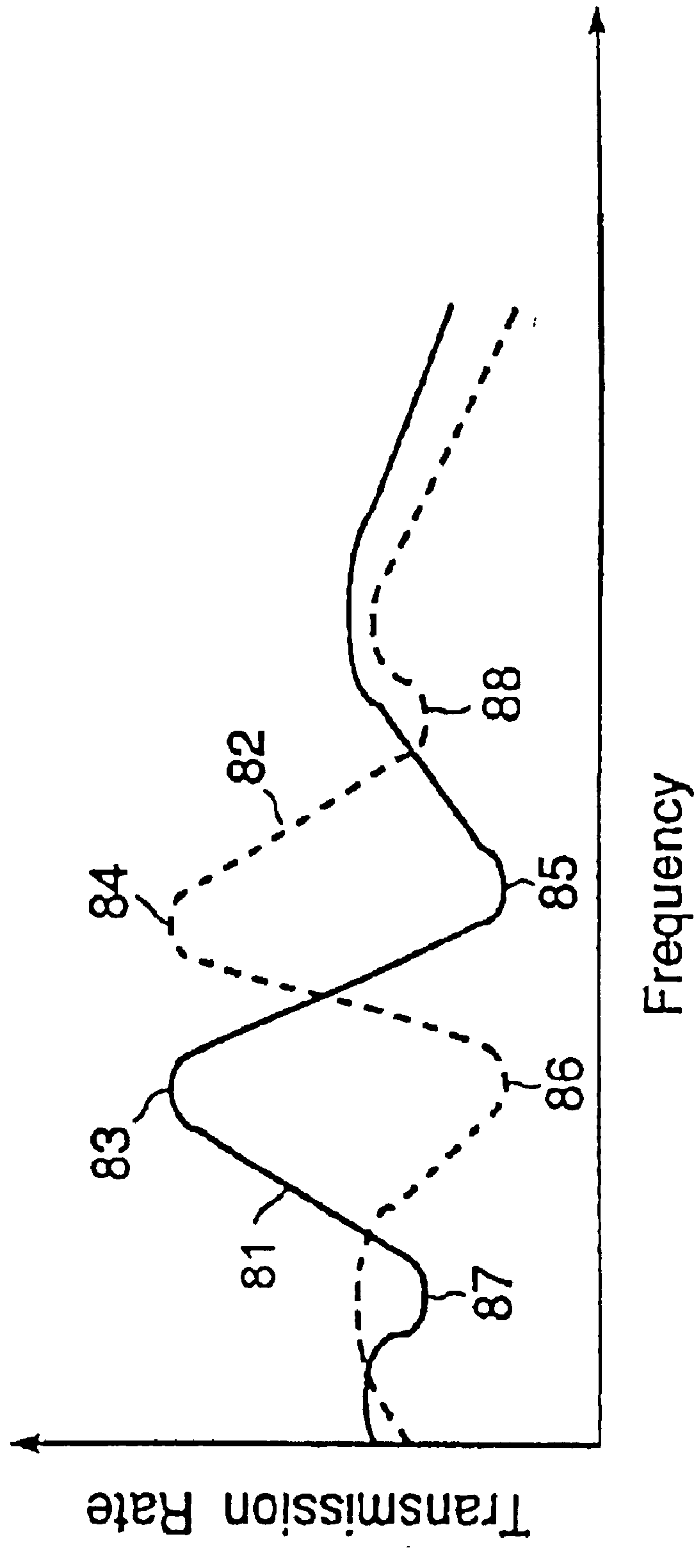
FIG. 6 shows filter characteristics for explaining the operation of a filter device for a transmit-receive antenna of Embodiment 2 of the invention.

FIG. 6 schematically shows the transfer rate of this filter device for a transmit-receive antenna. In this embodiment, a low frequency band is allocated to reception and a high frequency band is allocated to transmission.

Referring to FIG. 6, a transmission curve 81 shows the transmission performance of the receiving filter device, and a transmission curve 82 shows the transmission performance of the transmitting filter device. More specifically, the frequency region includes a reception passband 83 and a transmission passband 84. The transmission curve 81 for reception, having the reception passband 83 at a low frequency and a transmission-band attenuation pole 85 at a high frequency, inhibits the transmission frequency from entering into the receiver. The transmission curve 82 for transmission has an attenuation pole 86 at a low reception band, and forms a transmission passband at a high frequency. Furthermore, the transmission curve 81 for reception and the transmission curve 82 for transmission show attenuation poles 87, 88 of variable frequency notches for the elimination of spurious signals, respectively.

The frequency of the reception passband 83 coincides with the frequency of the reception-band attenuation pole 86 of the transmitting filter, and the frequency of the transmission passband 84 coincides with the frequency of the transmission-band attenuation pole 85 of the receiving filter. According to the circuit of the embodiment, the reception passband 83 and the transmission-band attenuation pole 85 of the receiving filter, as well as the transmission passbands 84 and the reception-band attenuation pole 86 of the transmitting filter both change synchronously with a constant frequency interval maintained.

Japanese Patent Publication No. 08-172333 discloses the behavior of this filter with an attenuation pole alone. The present embodiment achieves characteristics as a filter device for a transmit-receive antenna in combination of these polarized filters. In the filter device for a transmit-receive antenna, if coincident frequencies of the passband and the attenuation pole are changed with the interval of the two passbands maintained, then the relation of coincidence never collapses. By taking advantage of this characteristic, there can be obtained a filter device for a transmit-receive antenna in which, for example, the transmitting filter device and the receiving filter device are implemented by only two resonators each, far more simply than the conventional frequency-fixed duplex type filter devices for a transmit-receive antenna that would usually require about seven to ten resonators. This structure has an advantageous effect that the downsizing and manufacture of the filter device for a transmit-receive antenna is facilitated by reducing its parts count with the pass loss suppressed low.

Furthermore, with regard to unnecessary interfering signals and spurious signals, such attenuation poles 87, 88 as shown in FIG. 6 can be made coincident with the vary frequency which is exactly needed by using notch-type variable frequency resonators 33 or 34.

Embodiment 3:

In a filter of this embodiment, the variable frequency resonator is made up of a stripline type resonator provided on a ceramic board and a voltage-controlled variable capacitance device formed on the ceramic board.

In the filter device of this embodiment, one or more adaptive high-frequency filter(s) and one or more integrating circuit(s) for control use including a control section are applied onto the ceramic board, where the control-functioning integrated circuit controls the adaptive high-frequency filter, by which a small, high-performance high-frequency apparatus can be achieved.

In particular, the ceramic board may further include an antenna to implement a filter device for a transmit-receive antenna. Such a filter device can be utilized for radio communication devices, particularly cellular telephones, which are capable of simultaneous two-way radio communications with the antenna used for both transmission and reception.

In this case, the ceramic board is given by using a ceramic laminate, where a multiplicity of ceramic layers and stripline-resonator layers can be stacked and superimposed one on another so as to be made into an integral unit.

The antenna includes adaptive antenna arrays or ceramic antennas, where adaptive antenna arrays are preferable by virtue of their capablility of having directivity controlled by the control-functioning integrated circuit.

Figure 7A:
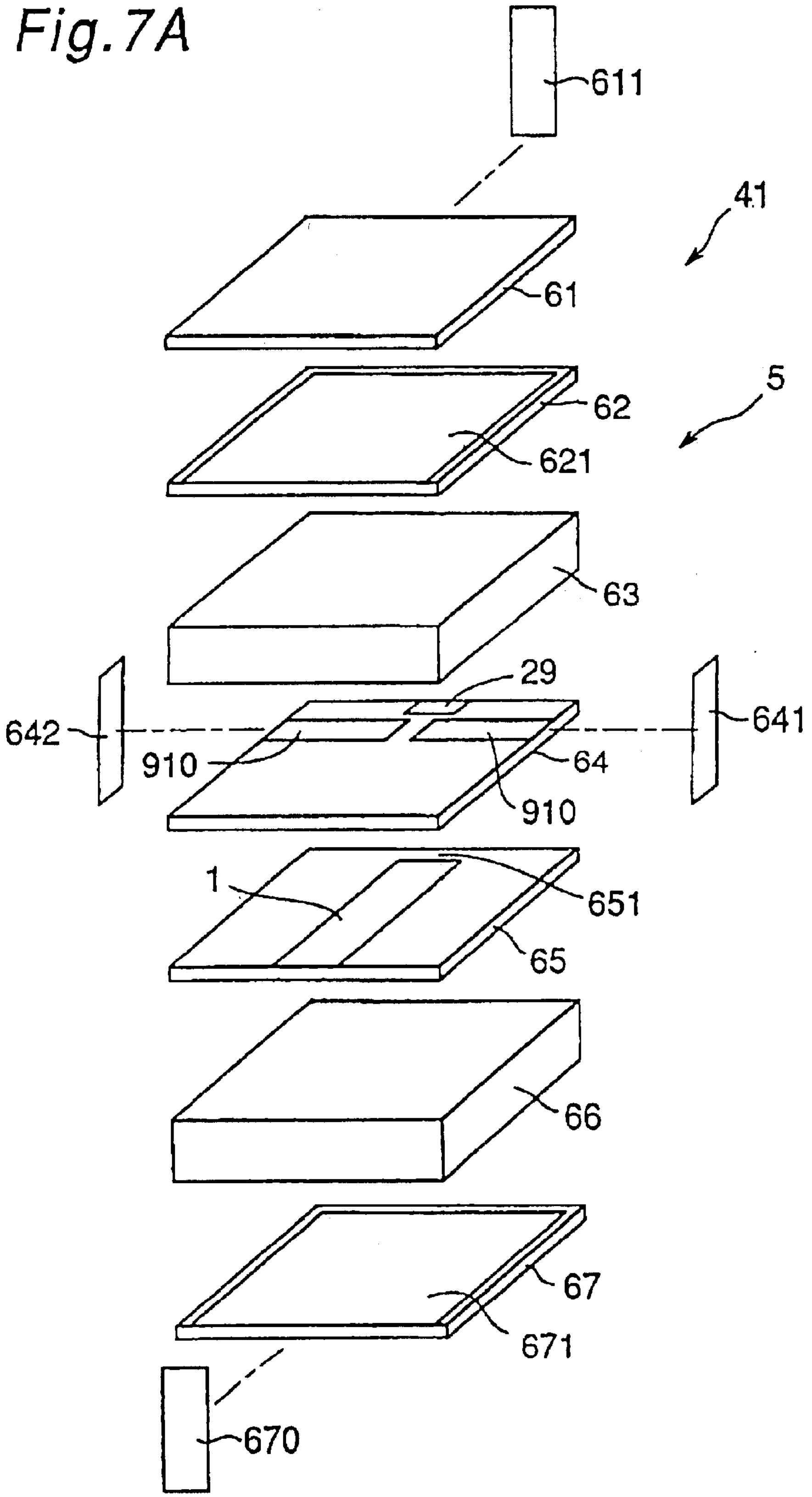
FIG. 7A is an exploded view showing the structure of a filter in which a resonator is buried in a ceramic laminate.

FIG. 7A shows an exploded view of a filter integrated with a ceramic laminate 41. Among ceramic layers 61–67, a stripline resonator 1 is capacitively coupled at its upper end with capacitors 910, 910 serving also as leads provided on an adjacent thin dielectric layer 64, the capacitors 910, 910 extending leftward and rightward, and further another capacitor 29 is also disposed so as to be capacitively coupled with the upper end of the resonator 1. The resonator 1 and these capacitors, as viewed in the figure, are sandwiched by shielding surfaces 621, 671 from above and below via the ceramic layers 63, 66, while electrodes 611, 641, 642 and 670 are joined with side portions of the laminate. The grounding electrode 670 is joined with the grounding end of the resonator 1, the capacitors 910, 910 are connected to the input- and output-side electrodes 641, 642, and the electrode 611 to be connected to a variable capacitance element is connected to the another capacitor 29. This variable-capacitance-element electrode 611 is connected to a separately provided voltage-controlled variable capacitance element, i.e., a varactor diode 42. In such a laminate 41, the individual layers are formed into a small-sized integral unit through the steps of printing, stacking and firing element metal thin films onto a dielectric ceramic green sheet.

The ceramic laminate with the variable frequency resonator integrated as shown above may also be used as a board itself on which other elements such as the varactor are fixedly placed, and besides, may be used in such a way that antenna array elements are mounted thereon or that an integrating circuit including the control section and the signal monitoring section is mounted thereon.

Figure 7B:
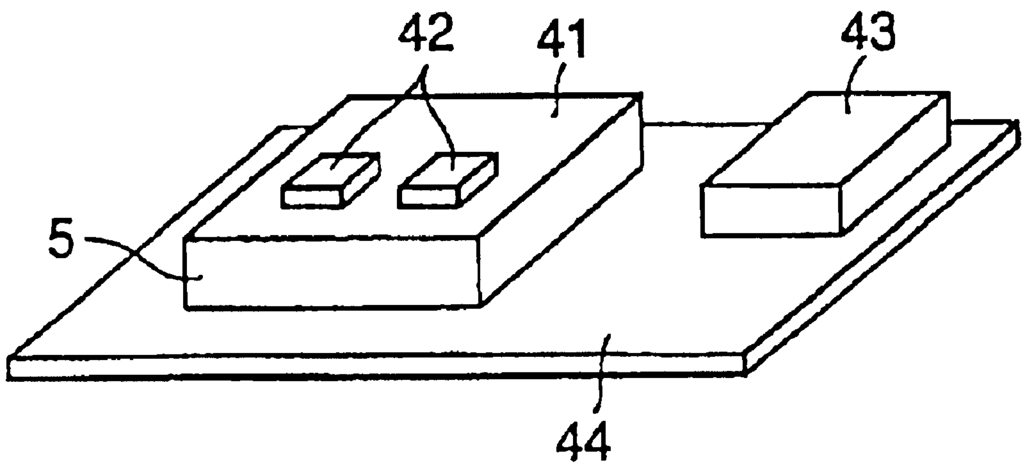
FIG. 7B is perspective view of an adaptive high-frequency filter according to an embodiment of the invention.

FIG. 7B shows an adaptive high-frequency filter device according to this embodiment. In this filter device, a ceramic laminate 41 is used as the ceramic board, a stripline resonator 1 is buried between layers of the ceramic laminate 41 as a resonator forming a filter 5, and a varactor diode 42 is attached on top of the ceramic laminate 41 to from a voltage-controlled variable capacitance element. Such a filter is mounted on another printed circuit board 44 together with a separate control-functioning integrated circuit 43, making up a filter device.

The use of the ceramic laminate 41 enables the downsizing of the filter, as well as the integration of the resonator and the varactor diode 42, in which case high-frequency characteristics are compensated while any deterioration of the high-frequency characteristics due to superfluous parasitic capacitances and parasitic inductors are avoided.

In addition, inductors or resistors may be mounted together with the varactor diode 42 on top of the laminate. The inductors and or capacitances may also be formed inside the laminate.

The control-functioning integrated circuit 43 may include the signal monitoring section 4 shown in Embodiments 1 and 2 and besides, preferably, the control section 3 as it is iterated into one unit. Because the signal transferred from the integrated circuit 43 to the laminate 41 (voltage-controlled variable frequency resonator element) is a DC control voltage signal, impedance matching in association with high frequencies does not need to be considered.

Figure 8:
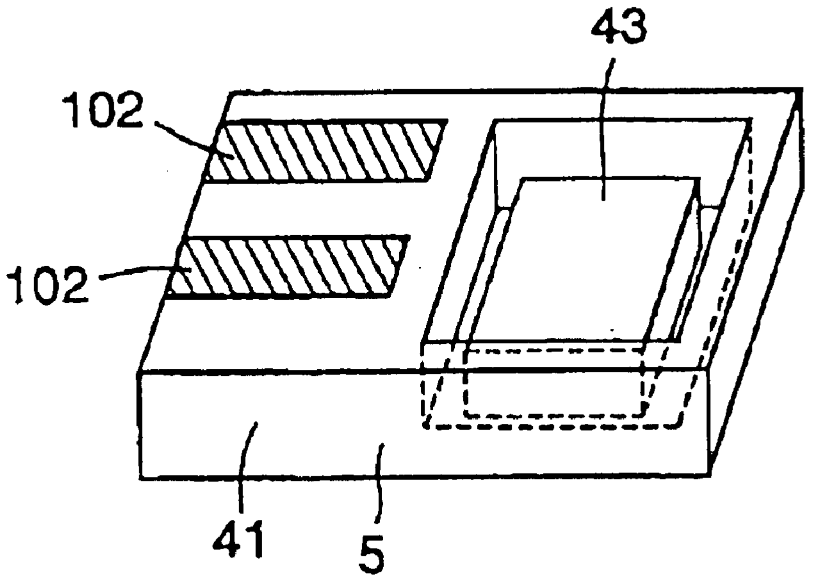
FIG. 8 is an appearance perspective view of an adaptive high-frequency filter which is another modification of Embodiment 3 of the invention.
Figure 9:
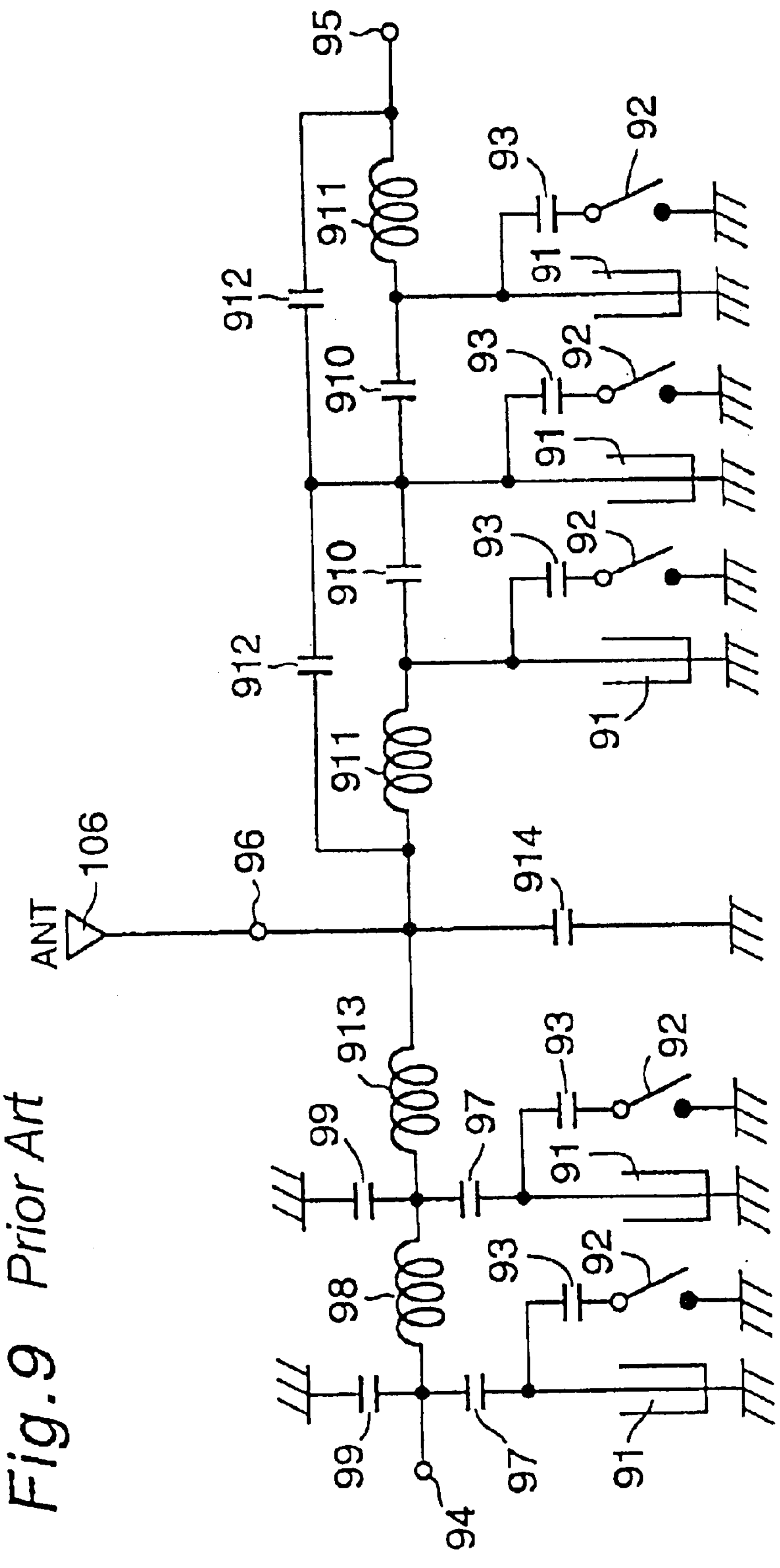
Fig.9 Prior Art
FIG. 9 shows a circuit diagram of a filter device for a frequency-shift type transmit-receive antenna according to the prior art.
Figure 10:
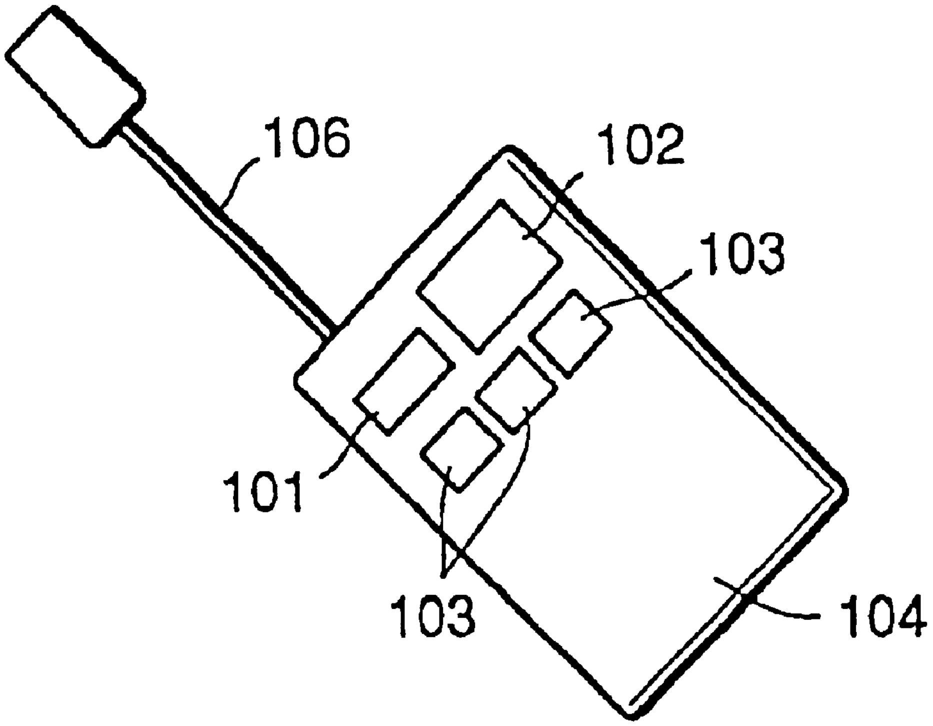
Fig. 10 Prior Art
FIG. 10 shows the internal structure of a conventional wireless apparatus for explaining the arrangement of individual high-frequency parts in a wireless apparatus according to the prior art.

FIG. 8 shows a perspective view of an adaptive high-frequency filter which is another modification of this embodiment. Referring to FIG. 8, in a ceramic laminate 41, an adaptive high-frequency filter 5 is integrated inside thereof, a control-functioning integrated circuit 43 is mounted thereon, and further, a built-in adaptive antenna array 102 is disposed on the surface thereof. All of these component parts are integrated with the ceramic laminate.

The built-in adaptive antenna array 102 controls the excitation amplitude and relative phase between one or more antenna elements (FIG. 8 illustrates a case of two elements) to control the beam direction and the null (zero) direction of the antenna pattern so that, for example, the signal-to-interfering wave ratio is maximized. The control computation, therefore, is operated inside the control-functioning integrated circuit 43, and the control signal is outputted from the control-functioning integrated circuit 43. The control-functioning integrated circuit 43 includes at least the signal monitoring section 4 shown in Embodiments 1 and 2 and besides, preferably, the control section 2 as it is integrated into one unit, by which a circuit for controlling the excitation amplitude and phase is made inside or on top of the ceramic laminate. Since the adaptive antenna array is controlled in consideration of ambient radio environments and human-body proximity effects, the characteristics of the radio section are improved dramatically. The adaptive high-frequency filter device 5 controls the pass characteristics of the filters so as to maximize the signal-to-interfering wave ratio in response to the radio environments as in the adaptive antenna array.

In this filter device, a stripline resonator element and a varactor diode are used to constitute a variable frequency resonator, and the control section in the integrating circuit applies a control voltage to the varactor diode, where this applied voltage is adjusted to vary the frequency of the resonator.

The filter device can be made up by connecting a plurality of voltage-controlled variable frequency filters, which are buried in the laminate, to one another. The plurality of filters are provided in combination of band pass type and band elimination type filters as shown in the above embodiment. The control section controls the respective voltages of the individual filters according to information derived from the signal monitoring section so that a desired signal can be assigned a passband while interfering signals can be assigned an elimination band, by which the characteristics of the wireless apparatus can be improved dramatically. Since the filters are made inside on top of the ceramic laminate, the filter device can be easily downsized.

The control-functioning integrated circuit 43 may be formed from a plurality of chips, but preferably, may be a single integrated circuit of large-scale integration. Such an integrated circuit 43 may include the transmitter and the receiver of the radio section, and may further include the signal monitoring section and the control section. As a result, the integrated circuit is enabled to generate control signals for the adaptive high-frequency filters and the built-in adaptive antenna array, thus allowing the whole wireless apparatus to be downsized, reduced in the parts count and reduced in cost.

What is claimed is:

1. A high-frequency filter device for connecting to a high-frequency stage of a wireless apparatus, the high-frequency filter device comprising:

at least one filter comprising a resonance element and a variable impedance element electrically connected to said resonance element, said at least one filter having a variable frequency function;

a control section operable to control said variable impedance element; and a signal monitoring section operable to output a control signal to said control section based on a frequency data signal of the wireless apparatus, wherein said signal monitoring section controls a frequency of said at least one filter such that the frequency is adaptively changed.

2. A wireless apparatus which includes the high-frequency filter device according to claim 1, wherein said at least one high-frequency filter is connected to an antenna circuit.

3. A high-frequency filter device for a transmit-receive antenna, the high-frequency filter device comprising:

a high-frequency transmitting filter device for transmission including a transmitting filter to be connected between an antenna and a transmitter of a wireless apparatus, said transmitting filter comprising a resonance element and a variable impedance element electrically connected to said resonance element, and said transmitting filter having a variable frequency function;

a high-frequency receiving filter device for reception including a receiving filter to be connected between the antenna and a receiver of the wireless apparatus, said receiving filter comprising a resonance element and a variable impedance element electrically connected to said resonance element, and said receiving filter having a variable frequency function;

a control section operable to apply a control signal to said variable impedance elements; and a signal monitoring section operable to control said control section to output the control signal based on a frequency data signal of the wireless apparatus, wherein said signal monitoring section controls frequencies of said transmitting filter and said receiving filter in such that the frequencies are adaptively changed.

4. A wireless apparatus which includes the high-frequency filter device for a transmit-receive antenna according to claim 3, wherein said high-frequency transmitting filter device for transmission is connected between the antenna and the transmitter of the wireless apparatus and said high-frequency receiving filter device for reception is connected between the antenna and the receiver of the wireless apparatus.

* * * * *